(12) United States Patent
Maegawa et al.

(10) Patent No.: US 12,283,620 B2
(45) Date of Patent: Apr. 22, 2025

(54) METHOD FOR MANUFACTURING SEMICONDUCTOR DEVICE

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventors: Yosuke Maegawa, Nisshin (JP); Yohei Iwahashi, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 307 days.

(21) Appl. No.: 18/054,568

(22) Filed: Nov. 11, 2022

(65) Prior Publication Data

US 2023/0170399 A1 Jun. 1, 2023

(30) Foreign Application Priority Data

Nov. 26, 2021 (JP) .................. 2021-191978

(51) Int. Cl.
*H01L 21/027* (2006.01)
*H01L 21/04* (2006.01)
(Continued)

(52) U.S. Cl.
CPC .... *H01L 29/66068* (2013.01); *H01L 21/0475* (2013.01); *H01L 29/7813* (2013.01)

(58) Field of Classification Search
CPC ............ H01L 21/0475; H01L 29/0696; H01L 29/0869; H01L 29/1608; H01L 29/66068; H01L 29/66734; H01L 29/7813
See application file for complete search history.

(56) References Cited

U.S. PATENT DOCUMENTS

| 5,783,491 A | 7/1998 | Nakamura et al. |
| 2012/0052642 A1* | 3/2012 | Endo .................. H01L 29/4236 438/270 |

(Continued)

FOREIGN PATENT DOCUMENTS

| JP | 2012-004360 A | 1/2012 |
| JP | 2017-117963 A | 6/2017 |

*Primary Examiner* — Eric A. Ward
(74) *Attorney, Agent, or Firm* — Posz Law Group, PLC

(57) ABSTRACT

A method for manufacturing a semiconductor device includes: preparing a semiconductor substrate; arranging a mask on one surface of the semiconductor substrate; forming opening portions in the mask by patterning so as to expose planned formation regions of the semiconductor substrate where trenches are to be formed; forming the trenches, which extend in a longitudinal direction along a planar direction of the semiconductor substrate, in the semiconductor substrate adjacent to the one surface, by performing a first etching using the mask; forming a rounded portion at an opening end portion of each of the trenches by performing a second etching in a state where the mask is arranged and under a condition that a selectivity of the mask is higher than that of the semiconductor substrate; and arranging a gate insulating film and a gate electrode in each of the trenches, thereby to form trench gate structures.

5 Claims, 5 Drawing Sheets

(51) Int. Cl.
*H01L 29/66* (2006.01)
*H01L 29/78* (2006.01)

(56) References Cited

U.S. PATENT DOCUMENTS

| | | | |
|---|---|---|---|
| 2013/0153992 A1* | 6/2013 | Loechelt | H01L 29/66727 438/270 |
| 2015/0303119 A1 | 10/2015 | Tamaso | |
| 2017/0103894 A1* | 4/2017 | Aichinger | H01L 21/0475 |

* cited by examiner

METHOD FOR MANUFACTURING SEMICONDUCTOR DEVICE

CROSS REFERENCE TO RELATED APPLICATION

The present application claims the benefit of priority from Japanese Patent Application No. 2021-191978 filed on Nov. 26, 2021. The entire disclosures of the above application are incorporated herein by reference.

TECHNICAL FIELD

The present disclosure relates to a method for manufacturing a semiconductor device having a trench gate structure.

BACKGROUND

For example, a semiconductor device is formed with a semiconductor element, such as a metal oxide semiconductor field effect transistor (MOSFET). Such a semiconductor device includes a semiconductor substrate having a drift layer, a base layer disposed adjacent to a first surface of the semiconductor substrate, and a source region disposed on a surface layer portion of the base layer. In addition, the semiconductor substrate is formed with a plurality of trenches penetrating through the source region and the base layer as well as extending in one direction, as a longitudinal direction, along a planar direction of the semiconductor substrate. A gate insulating film and a gate electrode are disposed in each of the trenches, thereby to form a trench gate structure.

Further, a drain region is disposed adjacent to a second surface of the semiconductor substrate. A first electrode is disposed adjacent to the first surface of the semiconductor substrate, and is electrically connected to the source region and the base layer. A second electrode is disposed adjacent to the second surface of the semiconductor substrate, and is electrically connected to the drain region.

In such a semiconductor device, an electric field is likely to concentrate at an opening end portion of the trench.

SUMMARY

The present disclosure describes a method for manufacturing a semiconductor device having a plurality of trench gate structures in which each of trenches of the trench gate structures is formed with a rounded portion at an opening end portion.

BRIEF DESCRIPTION OF THE DRAWINGS

Objects, features and advantages of the present disclosure will become more apparent from the following detailed description made with reference to the accompanying drawings, in which like parts are designated by like reference numbers and in which.

DETAILED DESCRIPTION

Figure 1:
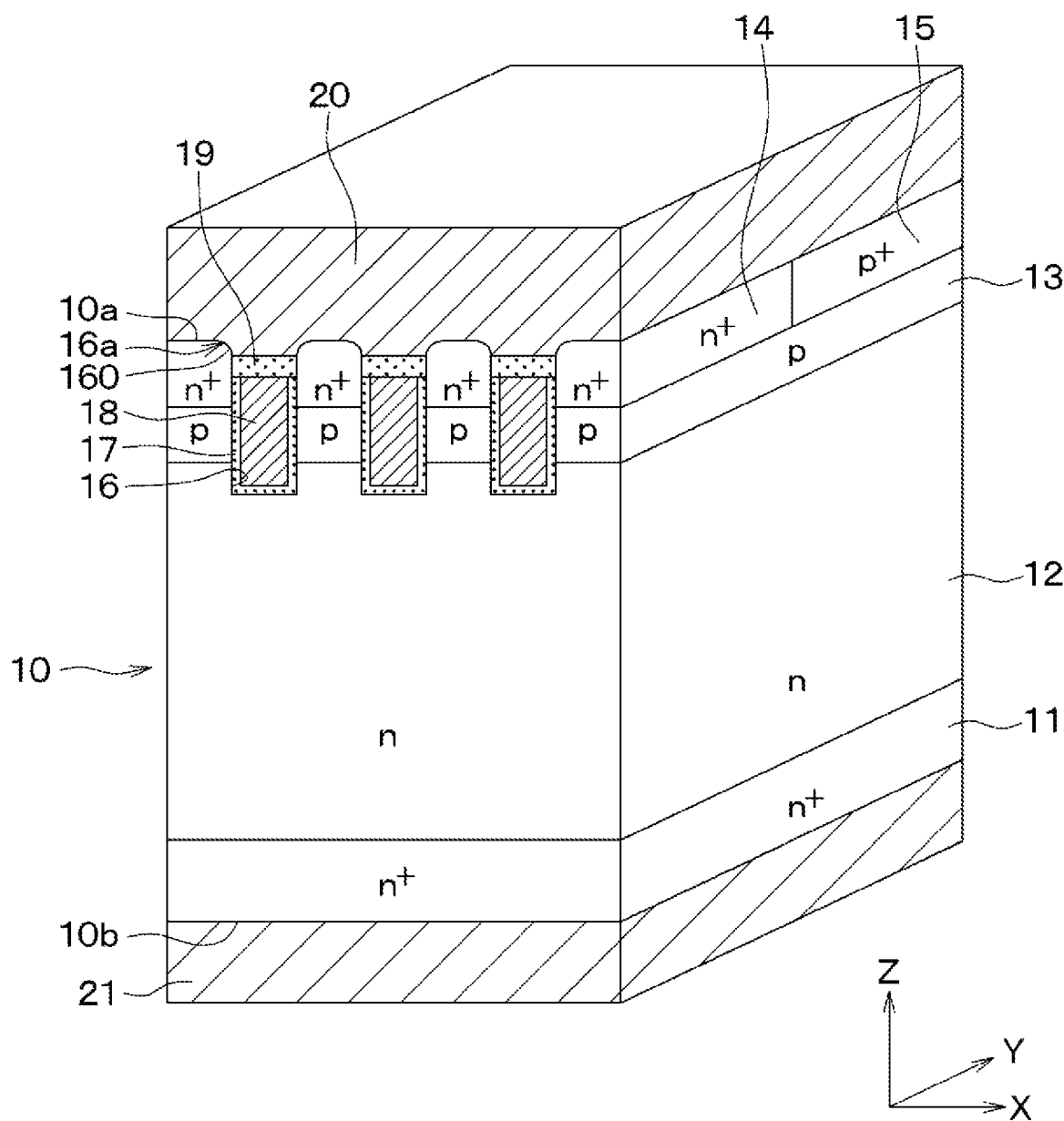
FIG. 1 is a perspective cross-sectional view of a SiC semiconductor device according to a first embodiment.

To begin with, a relevant technology will be described only for understanding the embodiments of the present disclosure. In a semiconductor device having a trench gate structure, an electric field is likely to concentrate at an opening end portion of the trench. Thus, it has been proposed to form a rounded portion at the opening end portion of the trench in order to suppress an electric field concentration.

To form such a trench, a mask may be arranged on one surface of a semiconductor substrate, and patterned to have an opening so as to expose a portion of the semiconductor substrate where the trench is to be formed. Subsequently, an anisotropic etching or the like may be performed using the mask to form the trench in the semiconductor substrate. Next, a process for widening the opening of the mask may be performed so as to expose an opening end portion of the trench from the mask. Then, an isotropic etching may be performed so as to round the opening end portion of the trench. In this way, the rounded portion may be formed. The isotropic etching for forming the rounded portion may be performed under a condition that a selectivity of the semiconductor substrate is higher than that of the mask.

In such a semiconductor device, it has been studied to reduce the on-resistance by reducing the distance between adjacent trenches. However, when the rounded portion is formed at the opening end portion of the trench as described above, the portion of the surface of the semiconductor substrate exposed from the mask is likely to be also completely removed due to the isotropic etching in which the semiconductor substrate has the higher selectivity. Further, when the rounded portion is formed at the opening end portion of the trench as described above, there is a possibility that the portion of the semiconductor substrate located near the opening portion of the mask will be also removed due to the isotropic etching in which the semiconductor substrate has the higher selectivity. That is, the opening end portion of the trench may be widened as a whole. For this reason, the portion of the surface of the semiconductor substrate located between the adjacent trenches may be reduced. As a result, there is a fear that the connectivity between an electrode disposed thereon and a source region or the like is reduced, and poor connection arises.

The present disclosure provides a method for manufacturing a semiconductor device that can suppress an occurrence of poor connection with an electrode while suppressing an occurrence of electric field concentration at an opening end portion of a trench.

According to an aspect of the present disclosure, a method for manufacturing a semiconductor device includes: preparing a semiconductor substrate having one surface; arranging a mask on the one surface of the semiconductor substrate; forming a plurality of opening portions in the mask by patterning the mask so as to expose a plurality of planned formation regions of the semiconductor substrate where a plurality of trenches are to be formed; forming a plurality of trenches, which extend in a longitudinal direction along a planar direction of the semiconductor substrate, in the semiconductor substrate adjacent to the one surface, by performing a first etching using the mask; forming a rounded portion at an opening end portion of each of the plurality of trenches by performing a second etching in a state where the mask is arranged and under a condition that a selectivity of the mask is higher than that of the semiconductor substrate; and arranging a gate insulating film and a gate electrode in each of the plurality of trenches thereby to form a plurality of trench gate structures.

In such a method, when the rounded portion is formed, the second etching is performed under the condition where the selectivity of the mask is higher than that of the semiconductor substrate. Therefore, when the rounded portion is formed, the one surface of the semiconductor substrate is less removed. As such, it is possible to suppress the portion of the one surface of the semiconductor substrate located between the trenches from being reduced. Accordingly, it is possible to suppress the occurrence of poor connection between the one surface of the semiconductor substrate and the electrode disposed adjacent to the one surface of the semiconductor substrate. Moreover, since the rounded portion is formed at the opening end portion of the trench, it is possible to suppress the occurrence of electric field concentration at the opening end portion of the trench.

Hereinafter, embodiments of the present disclosure will be described with reference to the drawings. In the embodiments, the same or equivalent parts are designated with the same reference numerals, and description thereof will not be repeated.

First Embodiment

A first embodiment will be described with reference to the drawings. A semiconductor device of the present embodiment is, for example, mounted on a vehicle such as an automobile, and used for a device for driving various electronic devices for the vehicle. In the present embodiment, it will be described a silicon carbide (hereinafter also referred to as SiC) semiconductor device in which an inverted MOSFET with a trench gate structure is formed. Hereinafter, a configuration of a cell region formed with the MOSFET will be described. However, an actual SiC semiconductor device further has an outer peripheral region formed with a field limiting ring (FLR) structure or the like surrounding the cell region.

Hereinafter, a direction along a planar direction of a substrate 11, which will be described later, is defined as an X-axis direction, and another direction intersecting the X-axis direction along the planar direction of the substrate 11 is defined as a Y-axis direction. Further, a direction orthogonal to the X-axis direction and the Y-axis direction is defined as a Z-axis direction. The planar direction is a direction along a surface of the substrate 11. In the present embodiment, the X-axis direction and the Y-axis direction are orthogonal to each other.

As shown in FIG. 1, the SiC semiconductor device is constructed using a semiconductor substrate 10. Specifically, the SiC semiconductor device includes an $n^+$ type substrate 11 made of SiC. In the present embodiment, for example, the substrate 11 has an off-angle of 0 to 8 degrees with respect to a (0001) Si plane. In addition, the substrate 11 has an n type impurity concentration of, for example, $1.0\times10^{19}/cm^3$, such as nitrogen or phosphorus, and a thickness of about 300 μm. The substrate 11 constitutes a drain region in the present embodiment and corresponds to a high concentration layer.

An $n^-$ type drift layer 12 and a p type base layer 13, which are made of SiC, are disposed in this order on a surface of the substrate 11 by epitaxial growth. An $n^+$ type source region 14 and $p^+$ type contact region 15 are disposed at a surface layer portion of the base layer 13. In the present embodiment, the source regions 14 and the contact regions 15 are alternately arranged along a longitudinal direction (that is, the Y-axis direction) of trenches 16, which will be described later. In the present embodiment, the source regions 14 correspond to an impurity region.

For example, the drift layer 12 has an n type impurity concentration of $0.5\times10^{16}$ to $2.0\times10^{16}/cm^3$ and a thickness of 5 to 14 micrometres (μm). The base layer 13 provides a region where a channel region is formed. For example, the base layer 13 has a p type impurity concentration of about $3.0\times10^{17}/cm^3$ and a thickness of 0.5 to 2 μm. The source region 14 has a higher impurity concentration than the drift layer 12. For example, a surface layer portion of the source region 14 has an n type impurity concentration of $2.5\times10^{18}$ to $1.0\times10^{19}/cm^3$ and a thickness of 0.5 to 2 μm. The contact region 15 has a higher impurity concentration than the base layer 13, and has a p type impurity concentration of $1.0\times10^{18}$ to $1.0\times10^{20}/cm^3$. Note that the impurity concentration and the film thickness of each of the drift layer 12, the base layer 13, the source region 14, and the contact region 15 are arbitrary, and are not limited to the examples described hereinabove.

In the present embodiment, as described above, the semiconductor substrate 10 includes the substrate 11, the drift layer 12, the base layer 13, the source regions 14, the contact regions 15, and the like. Further, the semiconductor substrate 10 has a first surface 10a provided by the source regions 14 and the contact regions 15, and a second surface 10b provided by the substrate 11. The first surface 10a and the second surface 10b will be also referred to as one surface and the other surface, respectively.

The semiconductor substrate 10 is formed with multiple trenches 16. Each of the trenches 16 penetrates the source region 14, the contact region 15 and the base layer 13 and reaches the drift layer 12. Specifically, the multiple trenches 16 are extended along the Y-axis direction, as a longitudinal direction, and are arranged in the X-axis direction at regular intervals in a form of stripe. Each of the trenches 16 has an opening end portion 16a defining an opening of the trench 16. The opening end portion 16a of each trench 16 is formed with a rounded portion 160.

A gate insulating film 17 is disposed on an inner wall surface of the trench 16, and a gate electrode 18 is disposed on the gate insulating film 17. The gate electrode 18 is made of doped polysilicon or the like. Accordingly, a trench gate structure is formed. Although not particularly limited, the gate insulating film 17 is formed by thermally oxidizing the inner wall surface of each of the trenches 16 or by performing a chemical vapor deposition (CVD) method. The gate insulating film 17 has a thickness of about 100 nm on both the side and the bottom of each of the trenches 16.

In the SiC semiconductor device of the present embodiment, the gate insulating film 17 and the gate electrode 18 are not arranged at the opening end portion 16a of the trench 16. Specifically, on the side surface of the trench 16, the gate insulating film 17 and the gate electrode 18 are not arranged in an area from the first surface 10a of the semiconductor substrate 10 to an intermediate position of the source region 14 and the contact region 15 in the Z-axis direction. That is, the opening end portion 16a on the side surface of the trench 16 is exposed from the gate insulating film 17 and the gate electrode 18. At the ends of the trench 16 in the longitudinal direction, the gate insulating film 17 and the gate electrode 18 are formed also at the opening end portion 16a of the trench 16, and extended above the first surface 10a of the semiconductor substrate 10. The gate electrode 18 extended above the first surface 10a of the semiconductor substrate 10 is electrically connected to a gate wiring (not shown) or the like.

An interlayer insulating film 19 is formed adjacent to the opening end portion 16a of the trench 16 so as to cover the gate electrode 18, the gate insulating film 17, and the like. However, the interlayer insulating film 19 of the present embodiment is arranged only inside the trench 16 and is not formed above the first surface 10a of the semiconductor substrate 10. In the present embodiment, by arranging the interlayer insulating film 19 in this manner, the distance between the adjacent trenches 16 can be easily narrowed, as compared to a following SiC semiconductor device. That is, in the SiC semiconductor device of the present embodiment, the distance between the adjacent trenches 16 can be easily narrowed, as compared to the case where the interlayer insulating film 19 is arranged above the first surface 10a of the semiconductor substrate 10 and is formed with contact holes to expose the source region 14 and the contact region 15. The interlayer insulating film 19 is made of borophosphosilicate glass (BPSG) or the like.

An upper electrode 20 is disposed above the first surface 10a of the semiconductor substrate 10. The upper electrode 20 is electrically connected to the source region 14 and the contact region 15. In the present embodiment, the upper electrode 20 corresponds to a first electrode.

The upper electrode 20 of the present embodiment is made of multiple metals such as Ni and Al. A portion of the multiple metals, which is in contact with a portion forming an n type SiC (that is, the source region 14), is made of a metal capable of making ohmic contact with the n type SiC. A portion of the multiple metals, which is in contact with at least p type SiC (that is, the contact region 15), is made of a metal capable of making ohmic contact with the p type SiC.

On the second surface 10b of the semiconductor substrate 10, a lower electrode 21 is provided, and is electrically connected to the substrate 11. In the present embodiment, the lower electrode 21 corresponds to a second electrode.

In the SiC semiconductor device of the present embodiment, with such a structure, a MOSFET of an n-channel type inverted trench gate structure is provided. Note that, in the present embodiment, n type and $n^+$ type correspond to a first conductivity type, and p type and $p^+$ type correspond to a second conductivity type.

In such a SiC semiconductor device, when a gate voltage applied to the gate electrode 18 is equal to or higher than a threshold voltage of the insulated gate structure, a current occurs between the upper electrode 20 and the lower electrode 21, so that the semiconductor device is in an on state. When the gate voltage applied to the gate electrode 18 is lower than the threshold voltage, the SiC semiconductor device is in an off state where no current occurs between the upper electrode 20 and the lower electrode 21.

Next, a method for manufacturing the SiC semiconductor device will be described with reference to FIGS. 2A to 2F. FIGS. 2A to 2F correspond to cross-sectional views of the semiconductor substrate 10 defined in a direction perpendicular to the Y-axis direction, that is, defined along a XZ plane in FIG. 1.

Figure 2A:
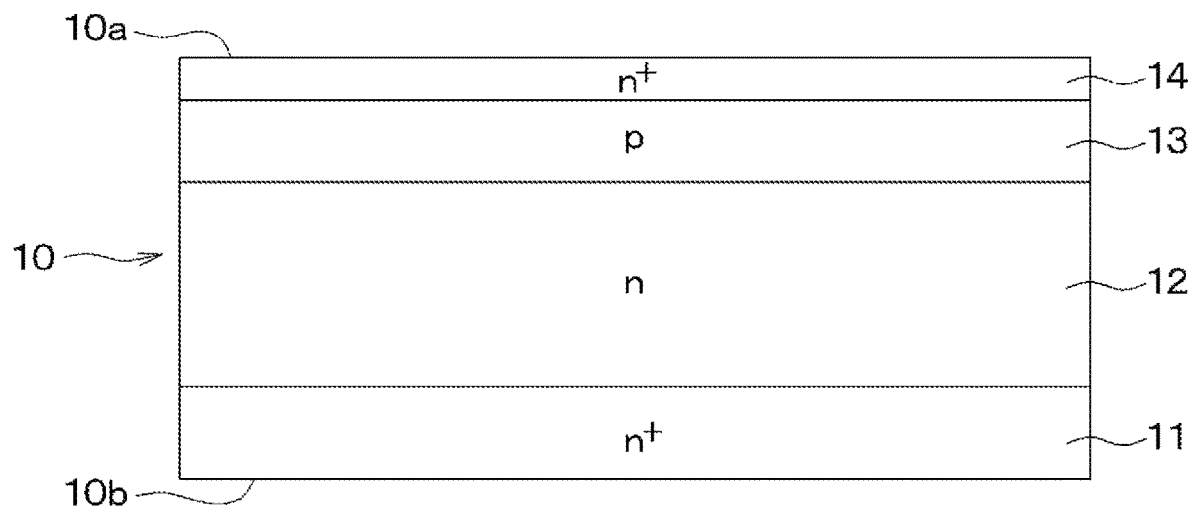
FIG. 2A is a cross-sectional view showing a manufacturing process of the SiC semiconductor device shown in FIG. 1.

First, as shown in FIG. 2A, a semiconductor substrate 10 having a substrate 11, a drift layer 12, a base layer 13, a source region 14 and a contact region 15 is prepared. Here, the substrate 11 will also be referred to as a substrate base. In the present embodiment, as shown in FIG. 3, a wafer-shaped semiconductor substrate 10 in which regions R to respective chips (hereinafter, chip formation regions R) are partitioned by dicing lines DL is prepared as the semiconductor substrate 10. FIGS. 2A to 2F each show a cross section of the semiconductor substrate 10 in one chip formation region R. The contact region 15 is formed in a cross section different from that in FIG. 2A.

Figure 2B:
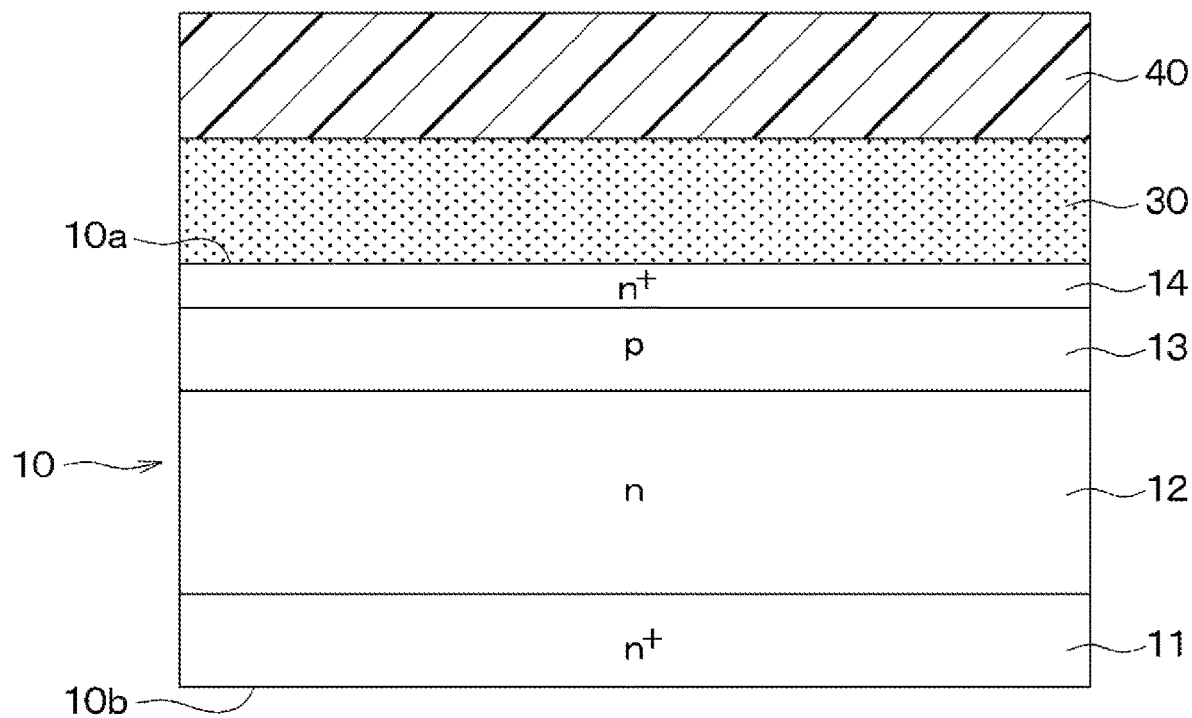
FIG. 2B is a cross-sectional view showing a manufacturing process of the SiC semiconductor device subsequent to FIG. 2A.
Figure 3:
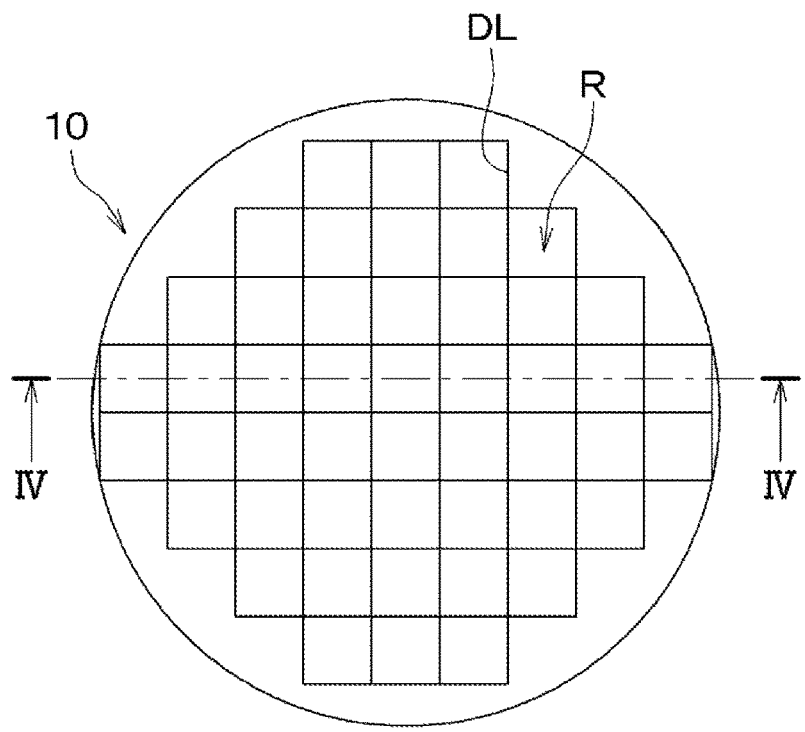
FIG. 3 is a plan view of a wafer-shaped semiconductor substrate.

Next, as shown in FIG. 2B, a mask 30 and a resist 40 are arranged in order on the first surface 10a of the semiconductor substrate 10. The mask 30 of the present embodiment is made of $SiO_2$ (that is, an oxide film) or the like formed by, for example, a chemical vapor deposition (CVD) method or the like.

Figure 2C:
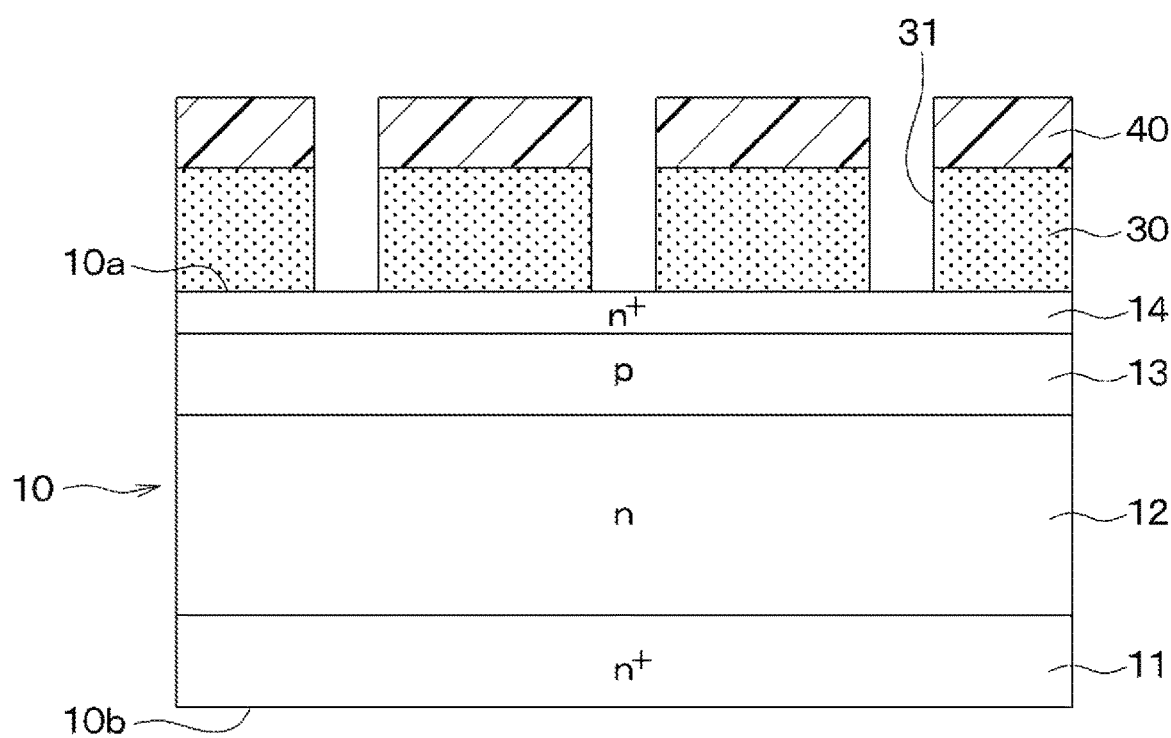
FIG. 2C is a cross-sectional view showing a manufacturing process of the SiC semiconductor device subsequent to FIG. 2B.

Subsequently, as shown in FIG. 2C, the mask 30 is patterned by performing photolithography, etching, and the like to form openings 31 so that planned formation regions of the semiconductor substrate 10 where the trenches 16 are to be formed are exposed.

Figure 2D:
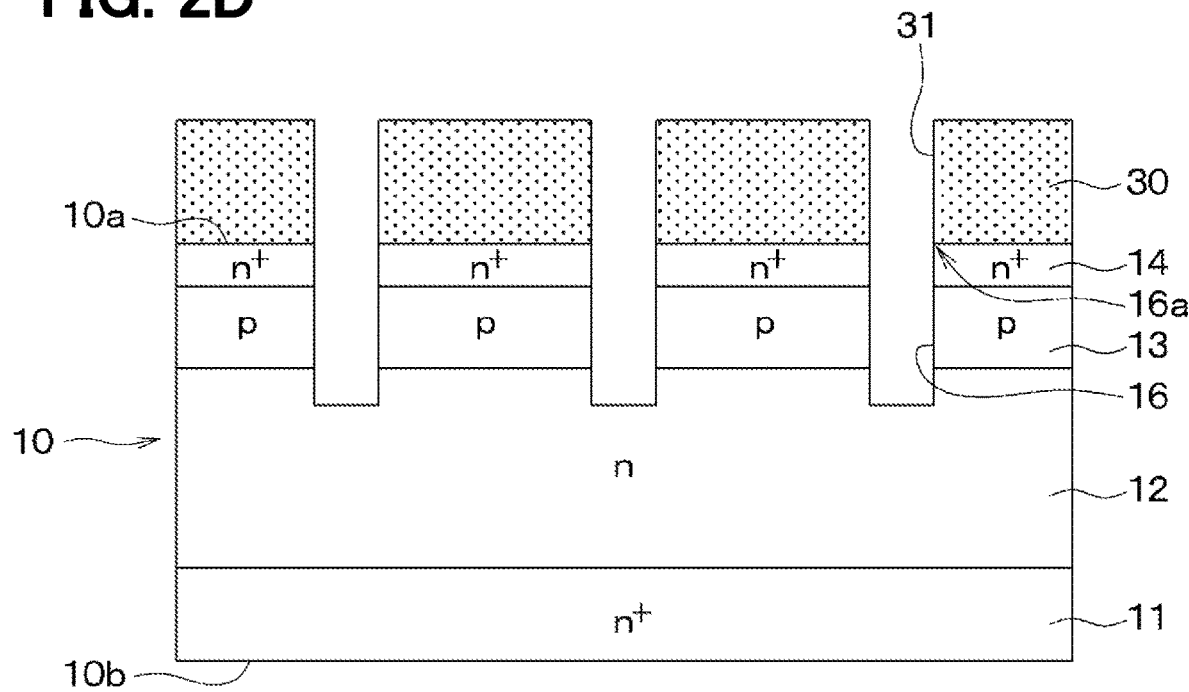
FIG. 2D is a cross-sectional view showing a manufacturing process of the SiC semiconductor device subsequent to FIG. 2C.

Then, as shown in FIG. 2D, after removing the resist 40 by ashing or the like, anisotropic etching or the like is performed using the mask 30 to form the trenches 16 in the semiconductor substrate 10. In this case, the anisotropic etching is performed under the condition that the selectivity of the semiconductor substrate 10 is higher than that of the mask 30. After this process is finished, the opening end portion 16a of the trench 16 is not exposed by the mask 30.

Figure 2E:
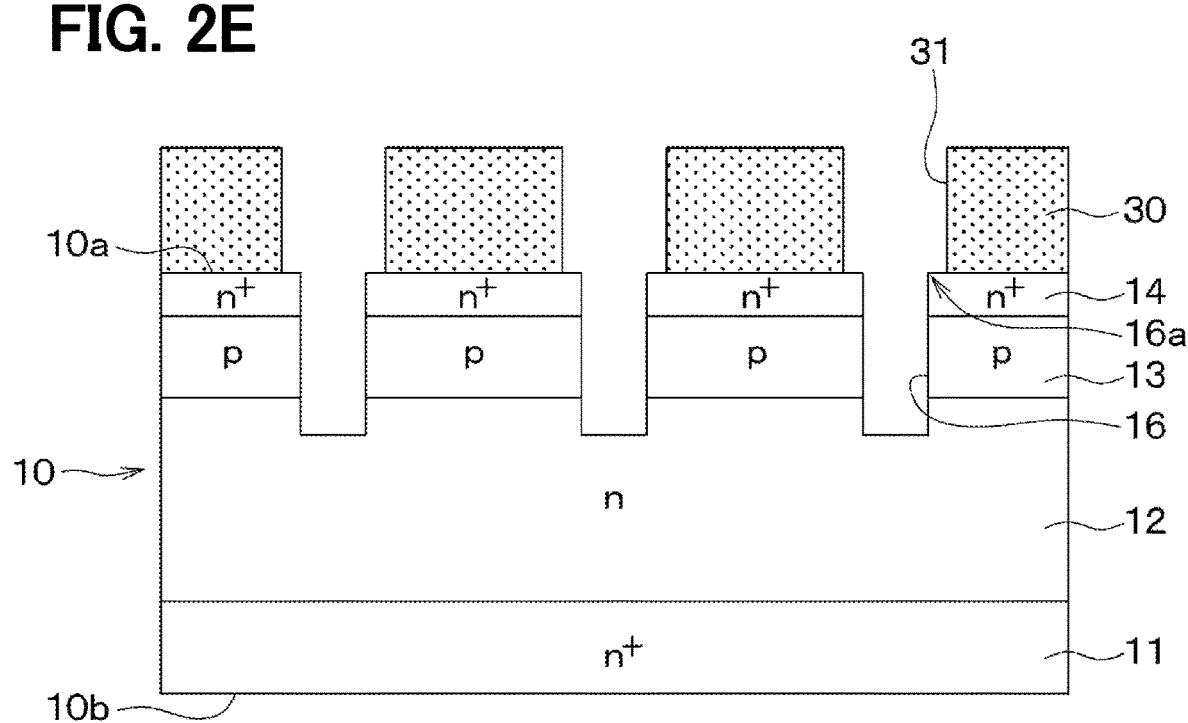
FIG. 2E is a cross-sectional view showing a manufacturing process of the SiC semiconductor device subsequent to FIG. 2D.

Subsequently, as shown in FIG. 2E, wet etching is performed to widen the opening 31 of the mask 30 so as to expose the opening end portion 16a of the trench 16. In other words, the opening 31 of the mask 30 is recessed so as to expose the opening end portion 16a of the trench 16. In the present embodiment, the wet etching is performed under the condition that the selectivity of the mask 30 is higher than that of the semiconductor substrate 10, so that the semiconductor substrate 10 is less likely to be etched.

Figure 2F:
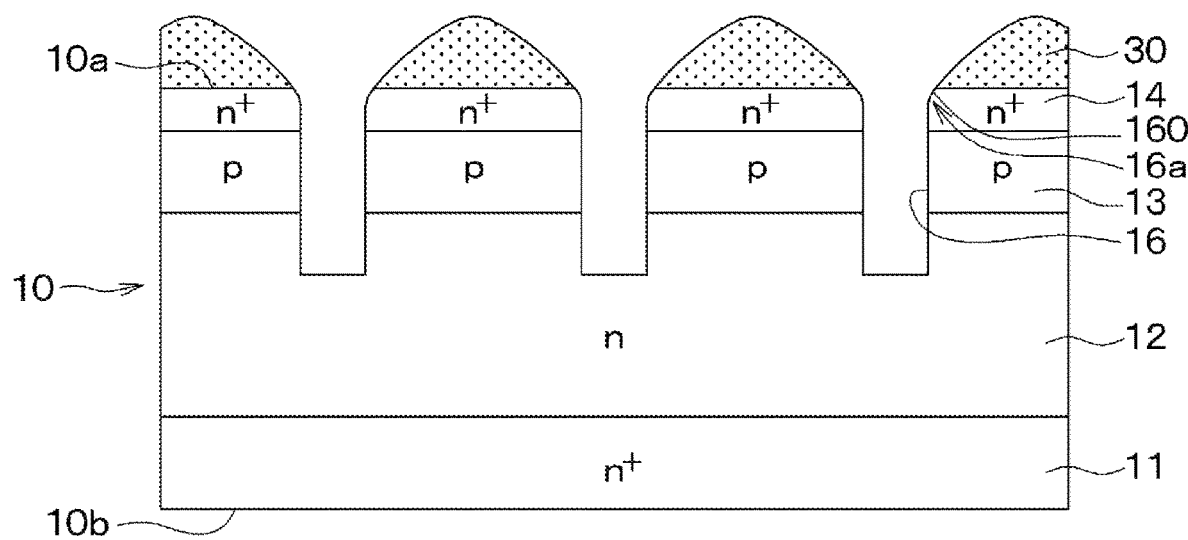
FIG. 2F is a cross-sectional view showing a manufacturing process of the SiC semiconductor device subsequent to FIG. 2E.

Then, as shown in FIG. 2F, etching is performed using the mask 30 so as to form a rounded portion 160 at the opening end portion 16a of the trench 16. In the present embodiment, the rounded portion 160 is formed at the opening end portion 16a of the trench 16 by performing anisotropic etching under the condition that the selectivity of the mask 30 is higher than that of the semiconductor substrate 10. That is, the rounded portion 160 is formed at the opening end portion 16a of the trench 16 by performing the anisotropic etching under the condition that the semiconductor substrate 10 is less scraped. As a result, the rounded portion 160 that is provided by slightly removing only the opening end portion 16a is formed. This process is performed under the conduction where the semiconductor substrate 10 is hardly scraped, and only the vicinity of the opening end portion 16a is exposed. Therefore, the first surface 10a of the semiconductor substrate 10 is less scraped. As a result, in the semiconductor substrate 10, the decrease of the first surface 10a between the adjacent trenches 16 can be suppressed. In this process, however, the bottom surface of the trench 16 is also slightly removed, as will be described later.

When the anisotropic etching is performed, for example, a mixed gas containing a CF-based gas and an SF-based gas is used as an etching gas, and the selectivity is adjusted by adjusting the flow rates of the CF-based gas and the SF-based gas. Specifically, the selectivity of $SiO_2$ (that is, the mask 30) can be increased by increasing the flow rate of the CF-based gas, and the selectivity of SiC (that is, the semiconductor substrate 10) can be increased by increasing the flow rate of the SF-based gas. Therefore, in the present embodiment, the flow rate of the CF-based gas is increased so that the selectivity of $SiO_2$ is higher than that of SiC.

Figure 4:
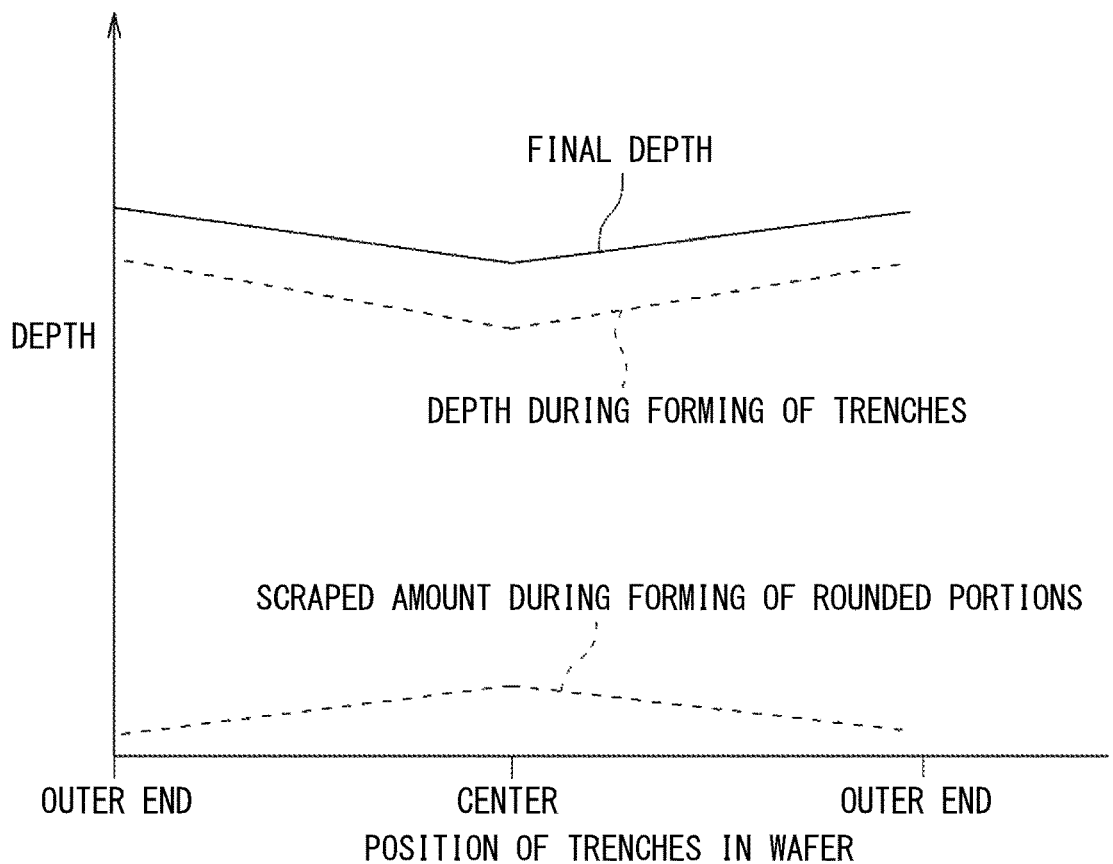
FIG. 4 is a diagram showing the depth of trenches with respect to locations in a wafer.

In the present embodiment, the wafer-shaped semiconductor substrate 10 was used, and the inventors of the present disclosure obtained the results shown in FIG. 4. FIG. 4 shows the depth of the trenches 16 along a line IV-IV in FIG. 3.

Specifically, as shown in FIG. 4, when the trench 16 is formed in the process of FIG. 2D, the etching gas tends to flow to the outer end of the wafer. For this reason, it was confirmed that the depth of the trench 16 was greater at the outer end of the wafer than at the center. That is, it was confirmed that, when the trenches 16 were formed, the semiconductor substrate 10 was more likely to be scraped at the outer end of the wafer. On the other hand, it was confirmed that, when the rounded portions 160 were formed at the opening end portions 16a of the trenches 16 in the process of FIG. 2F, the bottom surfaces of the trenches 16 were more likely to be scraped, that is, the trenches 16 were more likely deeper at the center of the wafer than at the outer end of the wafer, though the reason is not clear. That is, it was confirmed that, the area of the semiconductor substrate 10 that was more likely to be scraped in the forming of the trenches 16 is different, that is, opposite from that in the forming of the rounded portions 160 at the opening end portions 16a of the trenches 16. For this reason, in the present embodiment, by forming the trenches 16 and forming the rounded portions 160 at the opening end portions 16a of the trenches 16 as described above, variations in the final depth of the trenches 16 over the plane of the wafer can be suppressed.

Thereafter, although not particularly shown, the mask 30 is removed by etching or the like, and a general semiconductor manufacturing process is performed to form the gate insulating film 17, the gate electrode 18, the interlayer insulating film 19, the upper electrode 20, the lower electrode 21, and the like. In this way, the SiC semiconductor device is manufactured.

According to the present embodiment described above, the rounded portion 160 is formed by performing the etching under the condition that the mask 30 has the higher selectivity than the semiconductor substrate 10. Therefore, the first surface 10a of the semiconductor substrate 10 is less likely to be scraped, and the reduction of the first surface 10a of the semiconductor substrate 10 located between the trenches 16 can be suppressed. That is, it is possible to suppress the decreases in the source regions 14 and the contact regions 15 exposed from the first surface 10a of the semiconductor substrate 10. Therefore, it is possible to suppress the occurrence of poor connection between the upper electrode 20 and the source regions 14 and contact regions 15. Moreover, since the decreases of the source regions 14 and the contact regions 15 exposed from the first surface 10a of the semiconductor substrate 10 can be suppressed, the length between the adjacent trenches 16 can be shortened, and the on-resistance can be lowered. Since the rounded portion 160 is formed at the opening end portion 16a of the trench 16, the occurrence of electric field concentration at the opening end portion 16a of the trench 16 can be suppressed.

(1) In the present embodiment, the anisotropic etching is performed to form the rounded portion 160 at the opening end portion 16a of the trench 16. Therefore, damage to the side surfaces of the trench 16 can be suppressed. In addition, portions of the source region 14 and the contact region 15 under the mask 30 are less likely to be removed. Therefore, the decreases in the source region 14 and the contact region 15 exposed on the first surface 10a of the semiconductor substrate 10 can be suppressed.

(2) In the present embodiment, the wafer-shaped semiconductor substrate 10 is used. When the trench 16 is formed, the anisotropic etching is performed as a first etching under the condition that the semiconductor substrate 10 has the higher selectivity than the mask 30. Further, when the rounded portion 160 is formed at the opening end portion 16a of the trench 16, the anisotropic etching is performed as a second etching under the condition that the mask 30 has the higher selectivity than the semiconductor substrate 10. Therefore, the area of the semiconductor substrate 10 easily scraped when the trench 16 is formed is reversed from the area of the semiconductor substrate 10 easily scraped when the rounded portion 160 is formed at the opening end portion 16a of the trench 16. As a result, variations in the final depth of the trenches 16 over the plane of the wafer can be reduced.

Second Embodiment

A second embodiment will be described. In the second embodiment, the etching performed to form the rounded portion 160 at the opening end portion 16a of the trench 16 is different from that of the first embodiment. The other configurations are the same as those of the first embodiment, and therefore a description of the same configurations will be omitted below.

In the present embodiment, the rounded portion 160 is formed at the opening end portion 16a of the trench 16 by performing the process of FIG. 2F directly after the trench 16 is formed by the process of FIG. 2D. That is, the process of FIG. 2E is not performed between the process of FIG. 2D and the process of FIG. 2F. Specifically, in the present embodiment, the rounded portion 160 is formed at the opening end portion 16a of the trench 16 by performing isotropic etching such as a chemical dry etching (CDE). Also in this process, the isotropic etching is performed under the condition that the mask 30 has a higher selectivity than the semiconductor substrate 10. At this time, since the mask 30 is easily removed from the opening 31 side, as shown in FIG. 2F, the first surface 10a is removed from the opening 31 side of the mask 30, and the rounded portion 160 is thus formed at the opening end portion 16a. In this case, since the isotropic etching is performed under the condition that the selectivity of the mask 30 is higher than that of the semiconductor substrate 10, the rounded portion 160 can be formed by slightly removing only the corner of the opening end portion 16a. In addition, since the selectivity of the mask 30 is higher than that of the semiconductor substrate 10, it is possible to suppress the portion of the semiconductor substrate 10 located below the mask 30 from being removed by the isotropic etching. Also in the CDE, the condition that the mask 30 has the higher selectivity than the semiconductor substrate 10 can be easily adjusted by appropriately adjusting the flow rate of the etching gas.

Thereafter, the mask 30 is removed, and the gate insulating film 17 and the like are formed in the similar manner to the first embodiment. Thus, the SiC semiconductor device is manufactured.

According to the present embodiment described above, the rounded portion 160 is formed by performing the etching under the condition that the selectivity of the mask 30 is higher than that of the semiconductor substrate 10. Therefore, the effects similar to the first embodiment as described above can be achieved.

(1) In the present embodiment, when the rounded portion 160 is formed at the opening end portion 16a of the trench 16, the isotropic etching is performed by directly using the mask 30 that is used for forming the trench 16. Therefore, it is not necessary to widen the opening end portion 16a of the trench 16, and the manufacturing process can be simplified.

Other Embodiments

Although the present disclosure has been described in accordance with the embodiments, it is understood that the present disclosure is not limited to such embodiments or structures. The present disclosure encompasses various modifications and variations within the scope of equivalents. In addition, various combinations and configurations, as well as other combinations and configurations that include only one element, more, or less, are within the scope and spirit of the present disclosure.

For example, in the first embodiment described above, it is exemplified the MOSFET of the n-channel type trench gate structure in which the n type is the first conductivity type and the p type is the second conductivity type. However, such a configuration is only an example. As another example, the MOSFET may be of a p-channel type trench gate structure in which the conductivity type of each component is inverted with respect to the MOSFET of the n-channel type. Other than the MOSFET, the SiC semiconductor device may be formed with an IGBT with a similar structure. In the case of IGBT, although the $n^+$ type substrate 11 in each of the embodiments described above is modified to the $p^+$ type collector layer, other configurations are similar to the MOSFET as described in each of the embodiments described above.

Further, in the first embodiment described above, it is exemplified that the semiconductor substrate 10 is made of SiC. However, the semiconductor substrate 10 may be configured using a silicon substrate, another compound semiconductor substrate, or the like.

What is claimed is:

1. A method for manufacturing a semiconductor device having a plurality of trench gate structures, the method comprising:
   preparing a semiconductor substrate having one surface;
   arranging a mask on the one surface of the semiconductor substrate;
   forming a plurality of opening portions in the mask by patterning the mask so as to expose a plurality of planned formation regions of the semiconductor substrate where a plurality of trenches are to be formed;
   forming the plurality of trenches, which extend in a longitudinal direction along a planar direction of the semiconductor substrate, in the semiconductor substrate adjacent to the one surface, by performing a first etching using the mask;
   forming a rounded portion at an opening end portion of each of the plurality of trenches by performing a second etching in a state where the mask is arranged and under a condition that a selectivity of the mask is higher than that of the semiconductor substrate; and
   arranging a gate insulating film and a gate electrode in each of the plurality of trenches thereby to form the plurality of trench gate structures.

2. The method according to claim 1, wherein the forming of the rounded portion includes:
   widening the plurality of opening portions of the mask so as to expose the opening end portion of each of the plurality of trenches; and
   performing an anisotropic etching, as the second etching under the condition that the selectivity of the mask is higher than that of the semiconductor substrate.

3. The method according to claim 2, wherein
in the preparing of the semiconductor substrate, the semiconductor substrate is prepared as a wafer-shaped semiconductor substrate having a plurality of chip formation regions partitioned by a dicing line, and
in the forming of the plurality of trenches, the first etching is performed as an anisotropic etching under a condition that a selectivity of the semiconductor substrate is higher than that of the mask.

4. The method according to claim 1, wherein
in the forming of the rounded portion, the second etching is performed as an isotropic etching under a condition that a selectivity of the mask is higher than that of the semiconductor substrate, while directly using the mask used in the first etching.

5. The method according to claim 1, wherein
in the preparing of the semiconductor substrate, the semiconductor substrate prepared is made of a silicon carbide and includes a first or second conductivity type substrate base, a first conductivity type drift layer disposed on the substrate base, a second conductivity type base layer disposed at a surface layer portion of the drift layer, and a first conductivity type impurity region disposed at a surface layer portion of the base layer and having an impurity concentration higher than that of the drift layer, wherein the one surface is provided by a surface adjacent to the base layer, and
in the forming of the plurality of trenches, the plurality of trenches are formed to penetrate the impurity region and the base layer and to reach the drift layer.

* * * * *